United States Patent [19]

Thurber, Jr.

[11] Patent Number: 4,658,198

[45] Date of Patent: Apr. 14, 1987

[54] CHARGING CIRCUIT FOR A REFERENCE CAPACITOR

[75] Inventor: Charles R. Thurber, Jr., Sunnyvale, Calif.

[73] Assignee: Intersil, Inc., Cupertino, Calif.

[21] Appl. No.: 766,189

[22] Filed: Aug. 16, 1985

[51] Int. Cl.[4] .............................................. H03G 3/00
[52] U.S. Cl. ....................................... 320/1; 307/109; 323/274; 323/275; 340/347 AD; 340/347 CC; 340/347 M
[58] Field of Search ............................ 307/109; 320/1; 323/274, 275; 340/347 AD, 347 CC, 347 M

[56] References Cited

U.S. PATENT DOCUMENTS 4,555,655 11/1985 Tanaka ............................ 307/109 X Primary Examiner—T. J. Sloyan
Attorney, Agent, or Firm—Stanley C. Corwin; Mark Mollon

[57] ABSTRACT

A charging circuit is provided to decrease the settling time of a reference capacitor storing a reference voltage for data acquisition circuits. The charging circuit includes one or more comparator circuits for comparing the voltage across the reference capacitor to the reference voltage provided by a reference source. If the voltage from the reference source deviates by a predetermined amount, one or more buffer circuits rapidly charge the reference capacitor to a voltage substantially equal to the new reference voltage. The reference source is then coupled directly to the capacitor to complete the charging of the capacitor to the new reference voltage.

6 Claims, 6 Drawing Figures

CHARGING CIRCUIT FOR A REFERENCE CAPACITOR

BACKGROUND OF THE INVENTION

1. Field of the Invention

The present invention relates to circuits having a capacitor for storing a reference voltage, and more particularly, to such circuits for which the reference voltage varies.

2. Discussion of the Background of the Invention

Many circuits such as analog to digital converter circuits require a reference voltage for comparison and other purposes. This reference voltage is usually supplied by an external source and is typically stored on a reference capacitor. For a number of applications including data acquisition circuits, the reference voltage from the reference source does not always remain constant. Instead, the reference voltage may change to accommodate a change in the polarity or magnitude of the data to be processed. However, the internal circuitry of the data acquisition circuitry typically cannot react instantly to changes in the voltage of the reference source due to the capacitance of the reference capacitor. Instead, it usually takes a finite period of time to charge (or discharge) the capacitor to the new reference voltage. This charging period can often be as long as several seconds where the output impedance of the reference source is large. As a consequence, the data acquisition circuitry may output improper readings while the voltage across the reference capacitor is settling to the new voltage supplied by the reference source.

Sample and hold amplifiers have been designed to increase the charging rate of storage capacitors. However, these amplifiers have generally been intended for relatively low accuracy applications.

SUMMARY OF THE INVENTION

It is an object of the present invention to decrease the settling time of the reference capacitor which stores a reference voltage for high accuracy data acquisition circuits.

It is a further object to provide an improved analog to digital converter circuit in which the occurrence of false readings due to changes in reference voltages is reduced for high accuracy circuits.

These and other objects and advantages are achieved in a charging circuit in accordance with the present invention which monitors the reference voltage supplied by the reference source. In the illustrated embodiment, a comparator compares the voltage across the reference capacitor to the voltage of the reference source which has been disconnected from the reference capacitor. Should the reference source voltage change beyond a predefined limit, buffer circuits rapidly charge (or discharge) the capacitor to a voltage substantially equal to the new reference voltage in a fraction of the time often necessary for reference sources having a high output impedance. The reference source is then coupled to the reference capacitor to directly charge the capacitor to the reference voltage.

DETAILED DESCRIPTION OF THE DRAWINGS

Figure 1:
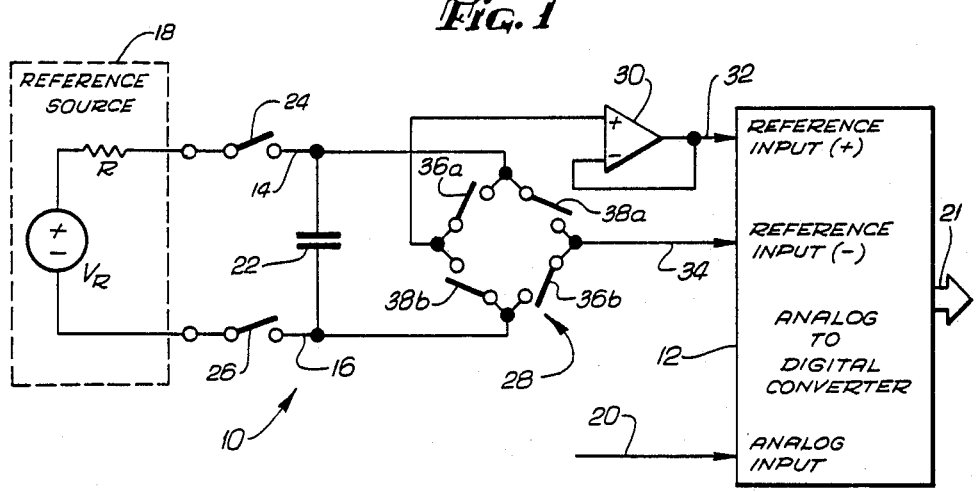
FIG. 1 is a schematic diagram of input circuitry for providing a reference voltage to an analog to digital converter circuit.

FIG. 1 shows a prior art reference voltage input circuit 10 for an analog to digital converter circuit 12. The input circuitry 10 has a pair of input terminals 14 and 16 which are adapted to be coupled to an external reference source 18. The reference source 18 provides a reference voltage $V_R$ to the input circuitry 10, which is utilized by the converter circuitry 12 to convert an analog signal at an analog input 20 to a digital representation at output 21. One application of the circuitry of FIG. 1 is to perform data acquisition for a digital processing circuit, for example.

A reference capacitor 22 is charged to the reference voltage $V_R$ when a pair of input switches 24 and 26 are closed. A switch bridge 28 and a buffer circuit 30 couples the reference capacitor 22 to the reference inputs 32 and 34 of the converter circuit 12. A positive reference $V_R$ is applied to the converter circuit 12 when the switches 36a and 36b are closed.

Conversely, a negative reference $-V_R$ is applied to the circuit 12 when the other two switches 38a and 38b of the switch bridge 28 are closed. The buffer circuit 30 reduces loading on the reference capacitor 22.

As previously mentioned, in many data acquisition applications, it is often necessary for the reference voltage to change. For example, the range of analog signals input at the input 20 may change sufficiently to require a larger or smaller reference voltage for accurate conversion. However, once the input reference voltage $V_R$ changes to a new value, the voltage across the capacitor generally does not instantly change to this new value. Instead, there is usually a delay before the reference capacitor voltage matches the new value of the reference source. This delay is a function of the capacitance of the reference capacitor 22, the output impedance R of the reference source 18 and the magnitude of the change in the reference voltage $V_R$. Since the output impedance R of the reference source 18 is often in the range of a megohm or larger, the charging delay of the reference capacitor 22 is often on the order of several seconds for a typical reference capacitor of 1 microfarad. As a consequence, the converter circuit 12 may output erroneous data during this several second delay period.

Figure 2:
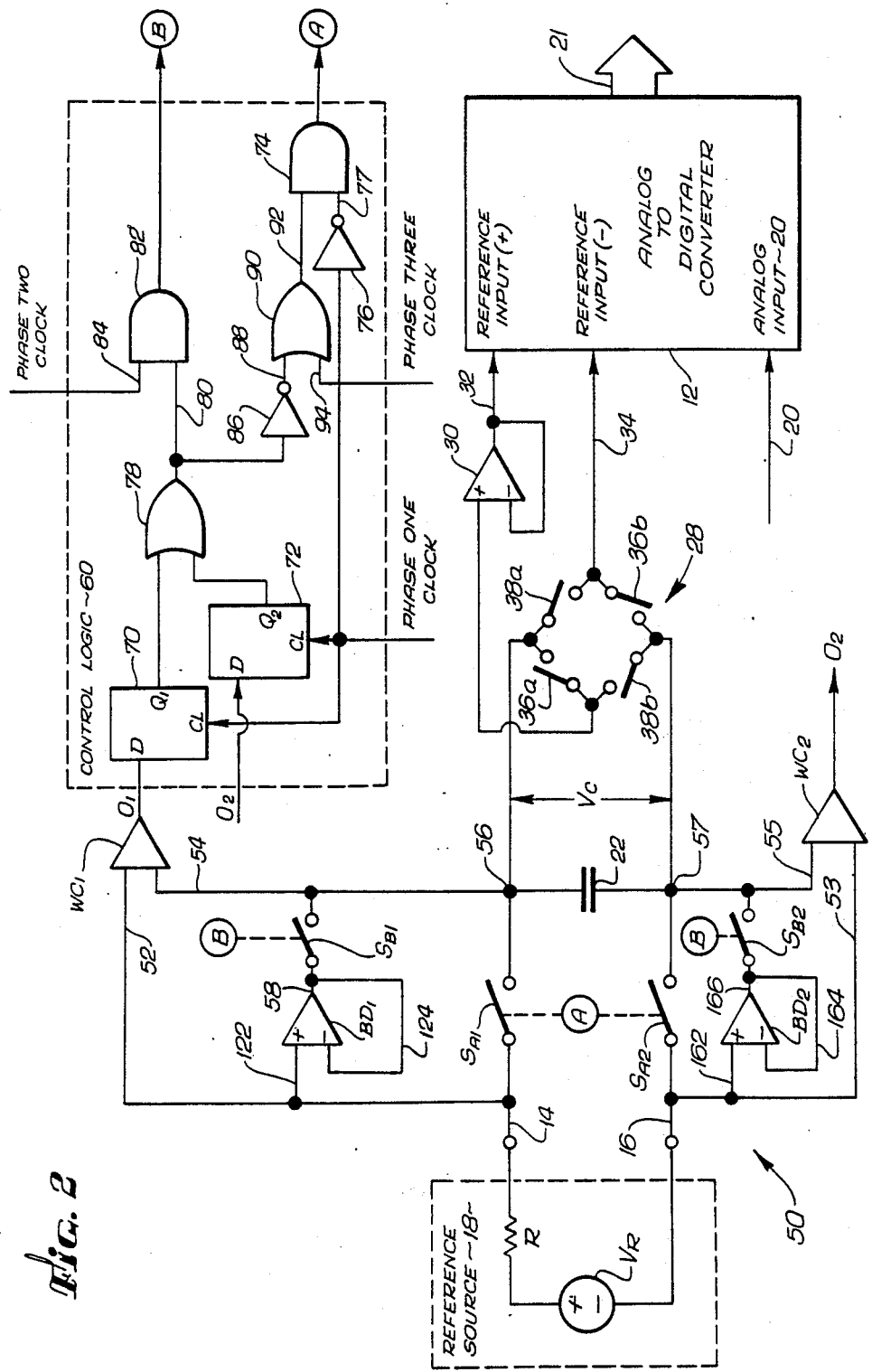
FIG. 2 is a schematic diagram of a reference signal input system in accordance with a preferred embodiment of the present invention.

In accordance with the present invention, FIG. 2 shows an improved input circuit 50 which ensures that the reference capacitor is quickly charged to the new reference voltage in a manner largely independent of the characteristics of the reference source.

As will be made more clear in the following discussion, the input circuit 50 periodically compares the voltage across the reference capacitor to the voltage provided by a reference source. If the voltage of the reference source 18 deviates significantly from the voltage $V_C$ across the reference capacitor, the circuit 50 rapidly charges (or discharges) the reference capacitor to a voltage substantially equal to that of the reference source. As a result, the reference voltage provided to the analog to digital converter circuit 12 more quickly matches the voltage provided by the reference source.

The input circuit 50, like the circuit of FIG. 1, includes a pair of input terminals 14 and 16 adapted to be coupled to a reference source such as the reference source 18. The reference voltage $V_R$ provided by the reference source 18 is stored on a reference capacitor 22. The input terminals 14 and 16, reference source 18 and reference capacitor 22 may be similar to those of like reference numerals in FIG. 1. Similarly, the input circuit 50 of the illustrated embodiment has a switch bridge 28 and a buffer circuit 30 coupled to the reference voltage inputs 32 and 34 of an analog to digital converter circuit 12, which may be similar to those of like reference numerals in FIG. 1. The input circuit 50 and analog to digital circuit 12 may be integrated as a single circuit using MOSFET technology. The reference capacitor 22 may be integrated with the circuit or provided as an external element to the integrated circuit.

In accordance with a preferred embodiment of the present invention, the input circuit 50 further includes a pair of window comparators $WC_1$ and $WC_2$ which compare the voltage provided by the reference source 18 to the voltage $V_C$ across the reference capacitor 22. Accordingly, the window comparators $WC_1$ and $WC_2$ have first inputs 52 and 53, respectively, coupled to the input terminals 14 and 16, respectively. Second inputs 54 and 55, of the comparators $WC_1$ and $WC_2$, respectively, are coupled to nodes 56 and 57, respectively, at each end of the reference capacitor 22.

The window comparator $WC_1$ compares the voltage at capacitor node 56 to the voltage at input 14. If the voltage at the input 14 should increase (or decrease) by more than a predetermined maximum relative to the voltage at capacitor node 56, the output of the window capacitor $WC_1$ will be set (logical HIGH). Similarly, if the voltage at the input node 16 should increase (or decrease) by more than a predetermined maximum relative to the voltage at capacitor node 57, the output of the window comparator $WC_2$ will be set. Each predetermined maximum defines a window about the voltage at a capacitor node in which the voltage at the associated input (14 or 16) is allowed to vary. Excursion of either input voltage outside the associated capacitor node window will set the associated window comparator. In the illustrated embodiment, the voltage window of each window comparator is on the order of a few millivolts. In this manner, the window comparators $WC_1$ and $WC_2$ closely monitor the voltage $V_C$ across the capacitor nodes 56 and 57 and the reference voltage $V_R$ from the reference source 18, and provide an output if the reference voltage $V_R$ from the reference source 18 falls outside the voltage windows, of the window comparators.

In the event the reference voltage from the reference source 18 does go outside either voltage window, rather than allowing the reference source 18 to charge the reference capacitor 22 to the new reference voltage, the input circuit 50 has a pair of buffer drivers $BD_1$ and $BD_2$ to rapidly charge the reference capacitor 22. As shown in FIG. 2 of the illustrated embodiment, the buffer driver $BD_1$ has an input 122 coupled to the input node 14 and an output 58 coupled by a switch $S_{B1}$ to the capacitor node 56. Similarly, the second buffer driver $BD_2$ has an input 162 coupled to the second input node 16, and an output 166 coupled by a second switch $S_{B2}$ to the capacitor node 57. When the switches $S_{B1}$ and $S_{B2}$ are closed (and switches $S_{A1}$ and $S_{A2}$ are open), the buffer drivers $BD_1$ and $BD_2$ rapidly charge (or discharge) the voltage $V_C$ across the reference capacitor 22 to the reference voltage $V_R$ of the reference source 18.

The states of the switches $S_{A1}$, $S_{A2}$, $S_{B1}$, and $S_{B2}$ are controlled by a control logic 60. In the illustrated embodiment, the control logic 60 provides two control signals, A and B, to control the opening and closing of the switches $S_{A1}$, $S_{A2}$, $S_{B1}$, and $S_{B2}$ in three phases. In the first phase, the switches $S_{A1}$, $S_{A2}$, $S_{B1}$ and $S_{B2}$ are all open as the window comparators $WC_1$ and $WC_2$ compare the voltage $V_C$ across the reference capacitor 22 to the voltage $V_R$ provided by the reference source 18. The open state of switches $S_{A1}$ and $S_{A2}$ facilitates the comparison by the window comparator, particularly for high output impedance reference sources.

If the voltage at either input node 14 or 16 is outside the associated voltage window, the control logic 60 closes the switches $S_{B1}$ and $S_{B2}$ during the second phase which allows the buffer drivers $BD_1$ and $BD_2$ to rapidly charge (or discharge) the reference capacitor 22. The buffer drivers $BD_1$ and $BD_2$ charge the reference capacitor 22 to the reference voltage $V_R$ minus (or plus) any offset voltage of the buffer drivers. During the third phase, the switches $S_{B1}$ and $S_{B2}$ are opened and the switches $S_{A1}$ and $S_{A2}$ are closed so that the reference source 18 charges (or discharges) the reference capacitor 22 to the final value $V_R$ of the reference source 18 eliminating any offset voltage of the buffer drivers.

The first control signal A of the control logic 60 controls the opening and closing of the switches $S_{A1}$ and $S_{A2}$. Conversely, the second control signal B from the control logic 60, controls the opening and closing of the switches $S_{B1}$ and $S_{B2}$. In the illustrated embodiment, the control logic 60 accepts three clock signals, PHASE ONE, PHASE TWO and PHASE THREE which define the three phases.

FIG. 2 shows an example of combinational logic for implementing a control circuit to generate the control signals for the input switches $S_{A1}$ and $S_{A2}$ and the buffer driver switches $S_{B1}$ and $SB_2$. These control signals are represented in the timing diagram of FIG. 3 which illustrates an example of the operation of the input circuitry 50 of FIG. 2. Before the start of the first phase, the initial states of the input switches $S_{A1}$ and $S_{A2}$ are both closed as represented by the logic HIGH state of control signal A of FIG. 3. Conversely, the buffer driver output switches $S_{B1}$ and $S_{B2}$ are open as represented by the logic LOW state of the control signal B of FIG. 3.

The first phase begins when the clock signal PHASE ONE goes to a logical HIGH state. Referring to FIG. 2, the PHASE ONE clock signal is coupled to the clock inputs of a pair of D-type flip-flops 70 and 72, and also to an input 77 of an AND gate 74 by an inverter 76. The output of the AND gate 74 provides the control signal A for the input switches $S_{A1}$ and $S_{A2}$. Thus, when the PHASE ONE clock signal goes to a logical HIGH state, the output A of the AND gate 74 goes to a logical LOW state as shown in FIG. 3, thereby opening the input switches $S_{A1}$ and $S_{A2}$.

Figure 3:
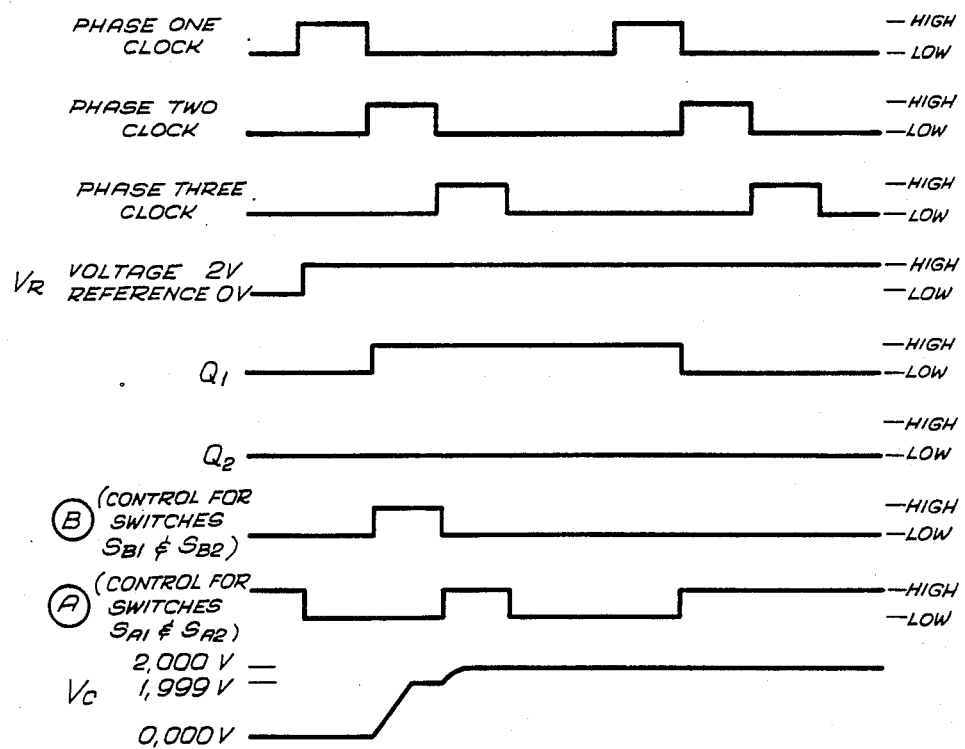
FIG. 3 is a timing diagram illustrating the operation of the system of FIG. 2.

In the example of FIG. 3, the reference voltage $V_R$ is initially zero volts. Accordingly, the voltage $V_C$ across reference capacitor 22 is assumed to have previously settled to the same voltage, that is, zero volts. However, the reference voltage $V_R$ does not always remain constant in many data acquisition applications. In the example of FIG. 3, the reference voltage $V_R$ is shown to change to two volts. This transition to two volts is illustrated as occuring during the PHASE ONE clock signal although the transition may occur at any time without adversely affecting the operation of the circuit 50.

When the reference voltage $V_R$ changes to two volts, the voltage at the input 14 moves outside the window of the window comparator $WC_1$. As a result, the window comparator output $O_1$ coupled to the input of the flip-flop 70 changes to a logical HIGH state, thereby setting the output $Q_1$ of the flip-flop 70 upon the termination of the PHASE ONE clock signal as shown in FIG. 3. The other flip-flop 72 is set by the second window comparator $WC_2$ if the voltage at the second input 16 goes outside the window of the window comparator $WC_2$.

The outputs $Q_1$ and $Q_2$ of the flip-flops 70 and 72 are coupled to the inputs of an OR gate 78, the output of which is coupled to an input 80 of an AND gate 82. The second input 84 of the AND gate 82 accepts the PHASE TWO clock signal. The input 80 of the AND gate 82 is at a logical HIGH state if either flip-flop 70 or 72 is set (corresponding to the reference voltage $V_R$ being outside of either of the windows of the window comparators). Consequently, when the PHASE TWO clock signal shifts to a logical HIGH state, the switch control signal B at the output of the AND gate 82 also shifts to a logical HIGH state, closing the buffer driver switches $S_{B1}$ and $S_{B2}$ during the second phase. Thus, if the voltage at either input 14 or 16 moves outside the windows of the window comparators $WC_1$ and $WC_2$, the control logic 60 couples the buffer drivers to the capacitor 22 through the switches $S_{B1}$ and $S_{B2}$ during the second phase.

As previously mentioned, the buffer drivers rapidly charge (or discharge) the reference capacitor 22 to within the buffer driver offset voltage of the reference voltage $V_R$. Thus, as shown in the example of FIG. 3, coupling the buffer devices to the capacitor 22 rapidly ramps up the voltage $V_C$ across the reference capacitor 22 during the second phase. The buffer drivers $BD_1$ and $BD_2$ have sufficient current capacity to charge the reference capacitor in just a few milliseconds to the value of 1.999 volts which is the new reference voltage less the buffer driver offset voltage which is approximately 0.001 volts in the illustrated embodiment.

As previously mentioned, the input switches $S_{A1}$ and $S_{A2}$ are open during the first phase. The switches $S_{A1}$ and $S_{A2}$ are also open during the second phase if either of the flip-flops 70 or 72 is set during the first phase, indicating that the reference voltage $V_R$ has moved outside the window comparator windows. To accomplish this, the output of the OR gate 78 is coupled by an inverter 86 to an input 88 of an OR gate 90. The output of the OR gate 90 is coupled to the second input 92 of the AND gate 74 which produces the control signal A for the input switches $S_{A1}$ and $S_{A2}$. The second input 94 of the OR gate 90 accepts the PHASE THREE clock signal which is at a logical LOW state in the second phase. Accordingly, if either flip-flop 70 or 72 is set, the output of the OR gate 90 is at a logical LOW state insuring that the output A of the AND gate 74 is also a logical LOW and further insuring that the input switches $S_{A1}$ and $S_{A2}$ are open to allow the buffer drivers $BD_1$ and $BD_2$ to charge (or discharge) the reference capacitor 22. If on the other hand, neither flip-flop 70 or 72 is set (indicating that the reference voltage $V_R$ is within the windows of the window comparators), both the output 92 of the OR gate 90 and the output A of the AND gate 74 are at a logical HIGH state during the second phase. As a result, the switches $S_{A1}$ and $S_{A2}$ are closed during the second phase since the buffer drivers $BD_1$ and $BD_2$ are not needed to charge the reference capacitor 22.

During the third phase, the PHASE THREE clock signal is at a logical HIGH state with the PHASE ONE and PHASE TWO clock signals at logical LOW states as shown in FIG. 3. This forces the output 92 of the OR gate 90 to a logical HIGH state and the output A of the AND gate 74 to a logical HIGH state, thereby closing the input switches $S_{A1}$ and $S_{A2}$. Since the PHASE TWO clock signal is at a logical LOW state during the third phase, the control signal B output of the AND gate 82 goes to a logical LOW state, thereby opening the buffer driver switches $S_{B1}$ and $S_{B2}$. During this third phase, the reference source 18 is coupled to the reference capacitor 22 to charge the reference capacitor 22 toward the final value of $V_R$.

As previously mentioned, the buffer drivers $BD_1$ and $BD_2$ charge (or discharge) the reference capacitor 22 to the reference voltage $V_R$ of the reference source 18 minus (or plus) the offset voltage of the buffer drivers. In the illustrated embodiment, this offset voltage is approximately one millivolt. If, for example, the impedance R of the reference source 18 is assumed to be one megohm and the reference capacitor 22 is one microfarad, the time for the voltage $V_C$ across the reference capacitor 22 to settle this remaining one millivolt is approximately 2.3 seconds. On the other hand, using the reference source 18 alone to charge the reference capacitor 22 the full two volts to the new value of $V_R$ can take approximately 10 seconds. Although these times differ only by a factor of approximately 3, the voltage $V_C$ across the reference capacitor of an input circuit in accordance with the present invention can be designed to change by as little as approximately 0.1% during the 2.3 second settling time while $V_C$ for many circuits of the prior art will change by a significantly greater percentage during this time period. Consequently, such previous circuits will likely indicate an overload condition for much of the settling time.

Figure 4:
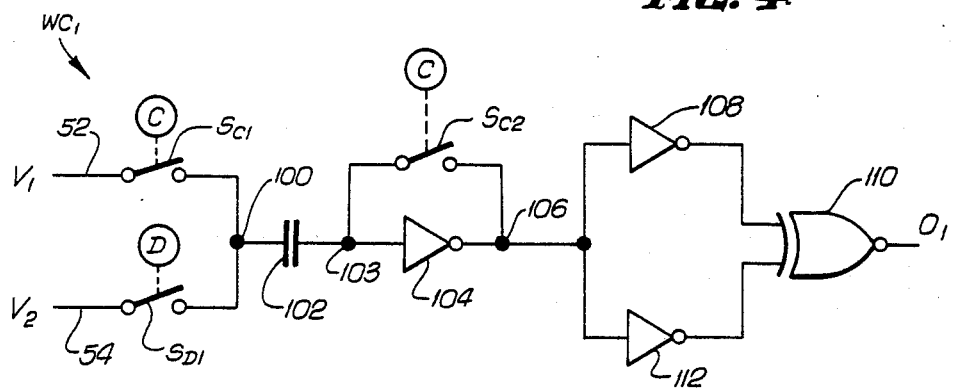
FIG. 4 is a schematic diagram of a window comparator for the system of FIG. 2.

FIG. 4 shows a schematic diagram of a window comparator circuit indicated generally at $WC_1$. The second window comparator $WC_2$ of FIG. 3 may have a similar design.

The inputs 52 and 54 of the window comparator $WC_1$ are connected by input switches $S_{C1}$ and $S_{D1}$, respectively, to a common node 100 at one end of an input capacitor 102. Alternate opening and closing of the input switches $S_{C1}$ and $S_{D1}$ alternately couple the input signals $V_1$ and $V_2$ to the input capacitor 102. It is seen in FIG. 2 that $V_1$ is the voltage at the input 14 and $V_2$ is the voltage at the capacitor node 56.

Figure 5:
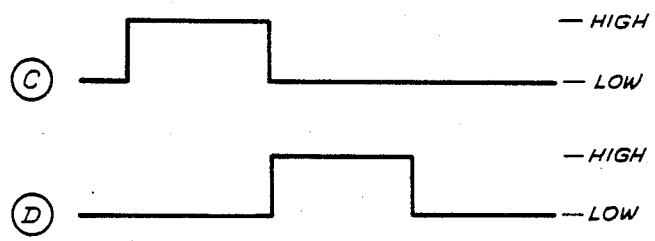
FIG. 5 is a timing diagram of two control signals for the window comparator of FIG. 4.

The other end of the input capacitor 102 is connected to the input 103 of an inverter 104 which has a feedback switch $S_{C2}$ connecting the inverter output 106 to its input. The switches $S_{C1}$ and $S_{C2}$ are controlled by a common control signal C and the second input switch $S_{D1}$ is controlled by a control signal D. As shown in FIG. 5, the control signal C is active first and does not overlap the control signal D. Consequently, in the illustrated embodiment, switches $S_{C1}$ and $S_{D1}$ are not closed at the same time.

When control signal C is active (logic HIGH), both switches $S_{C1}$ and $S_{C2}$ are closed. The input 103 of the inverter 104 is driven to the high gain region of the inverter 104, which may for purposes of illustration be assumed to be approximately 2.5 volts in the illustrated embodiment. Thus, the input capacitor 102 is charged to the difference between the inverter trip point and the voltage $V_1$ at the input node 52.

At the end of the pulse of the control signal C (logical LOW), both switches $S_{C1}$ and $S_{C2}$ open so that the charge across the input capacitor 102 and the inverter output voltage do not change. Control signal D subsequently goes to a logical HIGH state, closing input switch $S_{D1}$. As a result, the voltage at the output 106 of the inverter 104 shifts from the inverter trip point by an amount equal to:

$$(V_1-V_2)\times G$$

where G is the open loop gain of the inverter 104.

The output 106 of the inverter 104 is connected by a second inverter 108 to a first input of an exclusive NOR gate 110, and the output 106 is also connected by a third inverter 112 to a second input of the exclusive NOR gate 110. The inverter 108 has a relatively high trip point and the inverter 112 has a relatively low trip point, which may, for purposes of illustration, be assumed to be four volts and one volt, respectively. These particular trip points are given only for purposes of illustration.

The trip points of the inverters 108 and 112 define the window of the window comparator $WC_1$. If the voltage at the output 106 of the inverter 104 falls between the trip points of the inverters 108 and 112, the output $0_1$ of the NOR gate 110 remains at a logical LOW. However, if the voltage at the output 106 of the inverter 104 either exceeds the trip points of both inverters 108 and 112 or is below the trip points of both inverters 108 and 112, the output $0_1$ of the exclusive NOR gate 110 changes to a logical HIGH state, indicating that the difference between the two input voltages V1 and V2 of the window comparator $WC_1$ has exceeded the window. In this manner, the window comparator $WC_1$ monitors the voltages at the input 14 and the reference capacitor node 56 and provides an output if the reference voltage at input 14 moves outside the voltage window at the reference capacitor node 56.

The window comparator circuit of FIG. 5 has been simplified for purposes of clarity. The trip points of the gates 108 and 112 are preferably power supply independent. Texts entitled *Applications of Amplifiers, Third Generation Techniques*, §4.1.2, and *Designing with Operational Amplifiers, Applications Alternatives*, §3.1.2, by Jerald G. Graeme, published by Burr-Brown, describe other window comparator circuit design techniques and show examples of power supply independent window comparators.

Figure 6:
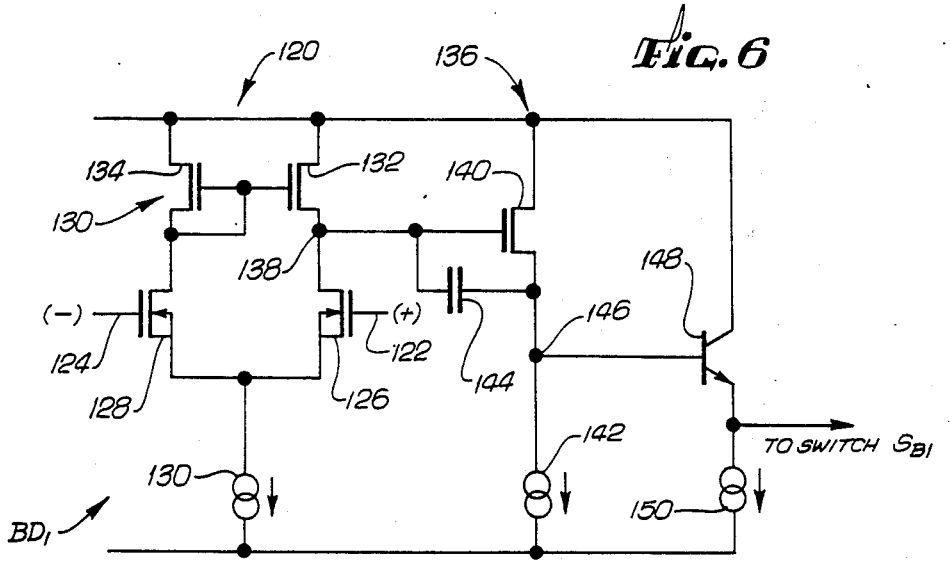
FIG. 6 is a schematic diagram of a buffer driver circuit for the system of FIG. 2.

FIG. 6 shows an example of a buffer driver circuit which is indicated generally at $BD_1$. The second buffer driver $BD_2$ of FIG. 2 may have a similar design.

The buffer driver $BD_1$ includes a differential amplifier 120 which has a non-inverting input 122 and an inverting input 124. As shown in FIG. 2, the non-inverting input 122 is connected to the input 14 of the input circuit 50 and the inverting input 124 is connected to the buffer driver output 58. The inputs 122 and 124 are connected to the gates of a pair of n-channel transistors 126 and 128, respectively, the sources of which are connected to a common current source 130. The drains of the input transistors 126 and 128 are connected to a pair of transistors 132 and 134, respectively, configured as a current mirror pair 130.

The output 138 of the differential amplifier 120 is connected to the input of an output transistor 140 of an output stage 136. The drain of the transistor 140 is also connected to a current source 142 and to its gate by a capacitor 144. The output 146 of the transistor 140 is connected to the base of an npn transistor 148 which has a current source 150 coupled to the emitter of the transistor 148.

As previously mentioned, the buffer driver $BD_1$ charges the capacitor node 56 to within the buffer driver offset voltage of the new reference voltage from the reference source. Accordingly, the buffer driver is preferably designed to minimize the buffer driver offset voltage.

It is seen from the above that the present invention permits the voltage stored on a reference capacitor to more quickly follow any changes in the reference voltage applied to the circuit. Thus, for data acquisition applications, accurate results are more quickly obtained. In addition, overrange and underrange indications after a reference voltage transition are reduced.

It will, of course, be understood that modifications of the present invention, in its various aspects, will be apparent to those skilled in the art, some being apparent only after study and others being merely matters of routine electronic design. For example, the present invention may be used in applications other than data acquisition circuits. Other embodiments are also possible with their specific designs dependent upon the particular applications. As such, the scope of the invention should not be limited by the particular embodiment hereindescribed, but should be defined only by the appended claims and the equivalents thereof.

I claim:

1. In a circuit adapted for use with a capacitor for storing a reference voltage supplied by a reference source, the improvement comprising:

comparison means for comparing the voltage across the capacitor and the voltage of the reference source, and providing an output when the difference in the capacitor voltage and the voltage of the reference source exceeds a predetermined maximum;

charge means responsive to the comparison means, for charging the capacitor when the difference in the capacitor voltage and the voltage of the reference source exceeds the predetermined maximum so as to reduce said difference, and switch means responsive to the comparison means output, for coupling the reference source to the capacitor to enable the reference source to directly charge the capacitor to a voltage equal to the reference voltage, and for uncoupling the reference source from the capacitor while the capacitor comparison means compares the reference source and capacitor voltages and while the charge means is charging the capacitor.

2. In a circuit having a capacitor for storing a reference voltage supplied by a reference source, the improvement comprising:

comparison means for comparing the voltage across the capacitor and the voltage of the reference source and providing an output when the difference between the capacitor voltage and the reference voltage exceeds a predetermined maximum;

buffer driver means for charging the capacitor to a voltage substantially equal to the reference voltage when the buffer driver means is coupled to the capacitor;

first switch means for slectively coupling and uncoupling the buffer driver means to and from, respectively, the capacitor;

second switch means for selectively coupling and uncoupling the reference source to and from, respectively, the capacitor; and control logic means responsive to the comparison means output for causing: (1) the first switch means to couple the buffer driver means to the capacitor and the second switch means to uncouple the reference source from the capacitor when the difference between the capacitor voltage and the reference voltage exceeds a predetermined maximum, and (2) subsequently causing the first switch means to uncouple the buffer driver means from the capacitor and to couple the reference source to the capacitor after the buffer driver means has charged the capacitor.

3. In an integrated analog to digital converter circuit of the type using a capacitor for storing a reference voltage supplied by an external reference source, the improvement comprising:

first and second input terminals adapted to be coupled to the external reference source;

a first window comparator having a first input coupled to the capacitor at one end and a second input coupled to the first input terminal, said first window comparator for providing an output if the voltage at the first input terminal deviates outside a predefined window about the voltage at said one end of the capacitor;

a second window comparator having a first input coupled to the other end of the capacitor and a second input coupled to the second input terminal, said second window comparator for providing an output if the voltage at the second input terminal deviates outside a predefined window about the voltage at said other end of the capacitor;

a first switch for coupling the first input terminal to one end of the capacitor in response to a first control signal;

a second switch for coupling the second input terminal to the other end of the capacitor in response to the first control signal;

first and second buffer means for charging the capacitor when coupled to the capacitor to a voltage substantially equal to the reference voltage, said first buffer means having a first input coupled to the first input terminal and the second buffer means having a first input coupled to the second input terminal;

a third switch having a control input, for coupling the first buffer means to said one end of the capacitor in response to a second control signal;

a fourth switch having a control input, for coupling the second buffer means to said other end of the capacitor in response to the second control signal; and control logic means responsive to the outputs of the first and second window comparators for generating the first and second control signals so that the first and second buffer means are coupled to the capacitor to charge the capacitor and the first and second input terminals are uncoupled from the capacitor if the voltage at either input terminal deviates outside the windows about the associated capacitor end.

4. The circuit of claim 3 wherein said control logic means comprises:

a first flip-flop having an input coupled to the output of the first window comparator, an input for a first clock signal, and an output;

a second flip-flop having an input coupled to the output of the second window comparator, a clock input for the first clock signal, and an output;

an OR gate having first and second inputs coupled to the outputs of the first and second flip-flops, respectively;

an AND gate having a first input coupled to the output of the OR gate and a second input for a second clock signal, and an output for the second control signal;

an inverter having an input coupled to the output of the OR gate, and an output;

a second OR gate having a first input coupled to the output of the inverter and a second input for a third clock signal;

a second AND gate having a first input coupled to the output of the second OR gate, a second input, and an output for the first control signal, and a second inverter having an input for the first clock signal and an output coupled to the second input of the second AND gate;

said second AND gate output being coupled to control inputs of the first and second switches and the output of the first AND gate being coupled to the control inputs of the third and fourth switches.

5. In an integrated data acquisition circuit of the type using a capacitor for storing a reference voltage supplied by an external reference source, the improvement comprising:

first and second input terminals adapted to be coupled to the external reference source;

a first window comparator having a first input coupled to the capacitor at one end and a second input coupled to the first input terminal, said first window comparator for providing an output if the voltage at the first input terminal deviates outside a predefined window about the voltage at said one end of the capacitor;

a second window comparator having a first input coupled to the other end of the capacitor and a second input coupled to the second input terminal, said second window comparator for providing an output if the voltage at the second input terminal deviates outside a predefined window about the voltage at said other end of the capacitor;

first buffer means responsive to the first window comparator, for charging the capacitor when the voltage at the first input terminal deviates outside the predefined window about the voltage at said one end of the capacitor so that the voltage at said one end of the capacitor is substantially equal to the voltage at the first input terminal; and second buffer means responsive to the second window comparator, for charging the capacitor when the voltage at the second input terminal deviates outside the predefined window about the voltage at said other end of the capacitor so that the voltage at said other end of the capacitor is substantially equal to the voltage at the second input terminal.

6. A method for keeping a reference capacitor in an electronic circuit charged at a reference voltage from a high impedance reference source, said circuit including a low impedance buffer circuit adapted to selectively alter the charge on said capacitor, said method comprising the steps of:

(1) disconnecting said reference capacitor from said reference source;
(2) comparing said reference voltage from said reference source with the voltage on said reference capacitor;
(3) if the absolute value of the difference between said reference voltage and the voltage on said reference capacitor is greater than a predetermined maximum, then switching on said buffer circuit to charge said reference capacitor to within the buffer circuit offset voltage of said reference voltage;
(4) connecting said reference capacitor to said reference source so that said reference capacitor is directly charged to said reference voltage by said reference source; and
(5) repeating steps 1–4 so that the voltage on said capacitor will quickly respond to changes in said reference voltage.

* * * * *

UNITED STATES PATENT AND TRADEMARK OFFICE
CERTIFICATE OF CORRECTION

PATENT NO. : 4,658,198

DATED : Apr. 14, 1987

INVENTOR(S) : Charles R. Thurber, Jr.

It is certified that error appears in the above-identified patent and that said Letters Patent is hereby corrected as shown below:

Column 8  Line 60  after "while the" delete --capacitor--

Signed and Sealed this

Ninth Day of August, 1988

Attest:

DONALD J. QUIGG

Attesting Officer

Commissioner of Patents and Trademarks